United States Patent
McGowan et al.

(10) Patent No.: US 8,972,359 B2
(45) Date of Patent: Mar. 3, 2015

(54) COMPACT FLOATING POINT DELTA ENCODING FOR COMPLEX DATA

(75) Inventors: Neil McGowan, Stittsville (CA); Bradley John Morris, Ottawa (CA); Edward Ken Kiu Mah, Nepean (CA)

(73) Assignee: Rockstar Consortium US LP, Plano, TX (US)

( * ) Notice: Subject to any disclaimer, the term of this patent is extended or adjusted under 35 U.S.C. 154(b) by 1306 days.

(21) Appl. No.: 11/303,990

(22) Filed: Dec. 19, 2005

(65) Prior Publication Data

US 2009/0041109 A1 Feb. 12, 2009

(51) Int. Cl.
*G06F 17/00* (2006.01)
*H03M 7/30* (2006.01)

(52) U.S. Cl.
CPC ....................................... *H03M 7/30* (2013.01)
USPC .......................................................... 707/693

(58) Field of Classification Search
USPC ............................. 707/101, 693, 703, 999.101
See application file for complete search history.

(56) References Cited

U.S. PATENT DOCUMENTS

| | | | |
|---|---|---|---|
| 4,661,862 A | 4/1987 | Thompson | |
| 5,909,256 A * | 6/1999 | Brown | 348/723 |
| 6,055,281 A | 4/2000 | Hendrickson et al. | |
| 6,137,922 A * | 10/2000 | Broussard et al. | 382/298 |
| 6,487,258 B1 * | 11/2002 | Jedwab et al. | 375/340 |
| 6,628,720 B1 * | 9/2003 | Sekii | 375/247 |
| 6,792,403 B2 * | 9/2004 | Kurtz | 704/225 |
| 7,212,583 B2 * | 5/2007 | Lindh | 375/296 |
| 7,225,136 B2 * | 5/2007 | Bruekers et al. | 704/500 |
| 7,394,410 B1 * | 7/2008 | Wegener | 341/61 |
| 2001/0029444 A1 * | 10/2001 | Rydbeck et al. | 704/200 |
| 2001/0047359 A1 * | 11/2001 | Videcrantz et al. | 707/101 |
| 2003/0026349 A1 | 2/2003 | Onggosanusi et al. | |
| 2003/0063654 A1 * | 4/2003 | Onggosanusi et al. | 375/130 |
| 2003/0144836 A1 * | 7/2003 | Kurtz | 704/230 |
| 2003/0163554 A1 * | 8/2003 | Sendrowicz | 709/220 |
| 2005/0084031 A1 | 4/2005 | Rosen et al. | |
| 2005/0157683 A1 | 7/2005 | Ylitalo et al. | |
| 2007/0115841 A1 * | 5/2007 | Taubman et al. | 370/252 |

* cited by examiner

*Primary Examiner* — Mohammed R Uddin
(74) *Attorney, Agent, or Firm* — Withrow & Terranova, PLLC

(57) ABSTRACT

A method and apparatus for compression of complex data signals within a telecommunications base station. The method includes representing a sample of a complex value discrete time signal using 2(L−N)−S mantissa bits and 2N+S exponent bits to realize peak output signal to noise ratios over a wider dynamic range compared to a conventional L-bit uniform quantization format. The increases in dynamic range and peak output SNR is achieved without increasing the average number of data bits per sample and with relatively simple computational effort.

3 Claims, 2 Drawing Sheets

COMPACT FLOATING POINT DELTA ENCODING FOR COMPLEX DATA

FIELD OF THE INVENTION

The present invention relates generally to data compression. More particularly, the present invention relates to compression of complex signals within telecommunications.

BACKGROUND OF THE INVENTION

Within the field of telecommunications, the rapid transfer of data is often degraded because of the inherent difficulties associated with moving a large amount of data over a given period of time. Compressing complex signals embodying such large amounts of data enables an increase to the amount of data moved over the same amount of time. Such data compression is the process of encoding information using fewer bits than a more direct (i.e., linear) representation would use. Data compression is implemented via the use of specific encoding schemes considered well known in the art such as, but not limited to, linear encoding, exponential encoding, and delta encoding. Data compression takes advantage of statistical redundancy found within most real-world data. As with any form of communication, compressed data communication only functions when both sender and receiver understand the encoding scheme. This typically requires an encoding mechanism and a decoding mechanism appropriately located within the communications link somewhere in the data path.

While data compression is often possible in telecommunications, some loss of signal fidelity inevitably occurs. Such signal losses using data compression are tolerated in view of the desirable reduction in costly resources such as disk space or connection bandwidth. Some data compression methods are reversible so that the original data can be reconstructed in their entirety (i.e., lossless data compression). Other such data compression methods accept some loss of data in order to achieve higher compression (i.e., lossy data compression). However, most data compression methods often also require lossy data compression). However, most data compression methods often also require significant information processing power that can also be resource intensive. Accordingly, designing any given data compression scheme will involve trade-offs among various factors including, but not limited to, compression capability, any amount of introduced distortion, delay constraints, and computational resource requirements.

It is, therefore, desirable to provide an optimized method and apparatus for data compression within telecommunications that reduces undesirable trade-offs.

SUMMARY OF THE INVENTION

It is an object of the present invention to obviate or mitigate at least one disadvantage of previous data compression methodologies.

In a first aspect, the present invention provides a method of bit conversion of a digital complex signal transmitting over a physical medium, the method including: receiving a digital complex signal; compressing the digital complex signal into a series of bits by sharing a common exponent across real and imaginary components of the complex signal; transmitting the series of bits across a physical medium; and expanding the series of bits to reconstitute the digital complex signal by again sharing the common exponent across the real and imaginary components of the complex signal.

In a further aspect, there is provided a method of bit conversion of a digital complex signal transmitting over a physical medium, the method including: receiving a digital complex signal; compressing the digital complex signal into a series of bits using linear encoding in combination with delta-averaging; transmitting the series of bits across a physical medium; and expanding the series of bits to reconstitute the digital complex signal by using linear decoding in combination with delta-averaging.

In still a further aspect, the present invention provides a method of bit conversion of a digital signal transmitting over a physical medium, the method including: receiving a digital signal; compressing the digital signal into a series of bits using encoding with delta-averaging; transmitting the series of bits across a physical medium; and expanding the series of bits to reconstitute the digital complex signal by using decoding with delta-averaging.

In yet a further aspect, the present invention provides an apparatus for encoding a digital complex signal transmitted over a physical medium, the apparatus including: a compression module compressing a digital complex signal into a series of bits by sharing a common exponent across real and imaginary components of said complex signal, the common exponent being determined by the compression module as an exponent of an exponential representation of a larger value of either the real or imaginary components.

In another aspect, the present invention provides an apparatus for decoding an encoded digital complex signal transmitted over a physical medium, the apparatus including: an expansion module expanding a series of bits forming an encoded form of a digital complex signal to reconstitute the digital complex signal by sharing a common exponent across real and imaginary components of the complex signal, the common exponent being determined by the expansion module as an exponent of an exponential representation of a larger value of either the real or imaginary components.

In still another aspect, the present invention provides an apparatus for encoding a digital complex signal transmitted over a physical medium, the apparatus including: a compression module compressing a digital complex signal into a series of bits using linear encoding in combination with delta-averaging.

In yet still another aspect, the present invention provides an apparatus for decoding a digital complex signal transmitted over a physical medium, the apparatus including: an expansion module expanding a series of bits forming an encoded form of a digital complex signal to reconstitute the digital complex signal by using linear encoding in combination with delta-averaging.

In again a further aspect, the present invention provides an apparatus for encoding a digital signal transmitted over a physical medium, the apparatus including: a compression module compressing a digital complex signal into a series of bits by using encoding with delta-averaging.

In still again a further aspect, the present invention provides an apparatus for decoding a digital signal transmitted over a physical medium, the apparatus including: an expansion module expanding the series of bits to reconstitute the digital complex signal by using decoding with delta-averaging.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 1:
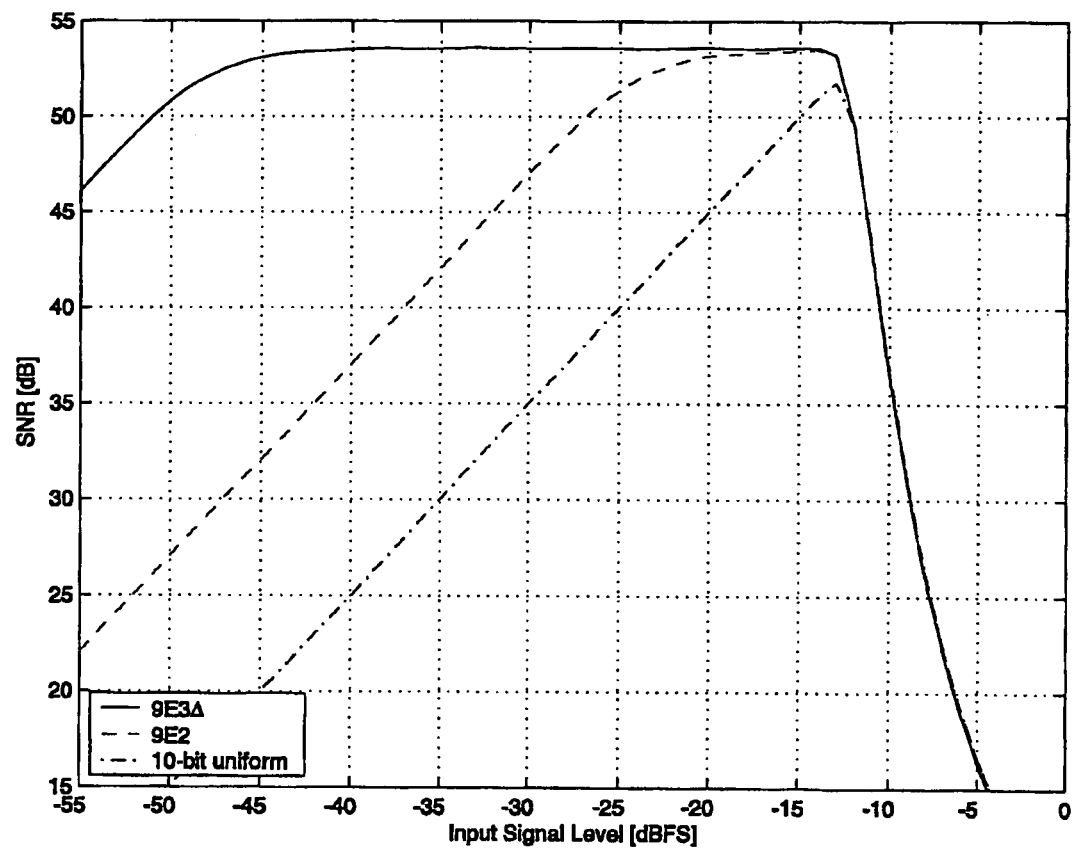
FIG. 1 is a graphical comparison of output signal to noise ratio (SNR) for different 10-bit quantization formats.

Generally, the present invention provides a method and apparatus for compression of complex data signals—i.e., digital discrete time complex signals. The invention includes a method of representing a sample of a complex value discrete time signal using 2(L−N)−S mantissa bits and 2N+S exponent bits to realize peak output SNR over a wider dynamic range compared to a conventional L-bit uniform quantization format. The improvement in dynamic range and peak output SNR is achieved without increasing the average number of data bits per sample and with relatively simple computational effort. The resultant SNR is dependent upon the value of L and power spectrum of the signal.

Within a telecommunications network, the present invention is described for purposes of illustration as residing within an Intermediate device between the radio and modem of a typical base station. Such intermediate device could conventionally provide routing and/or signal processing typically found between the radio and modem (or multiple radios and modems) and also include a module incorporating the present invention. Such module could be in the form of hardware such as an application specific integrated circuit (ASIC) or field programmable gate array (FPGA). Alternatively, such module may be an encoder/decoder device that implements the present invention in terms of software. In terms of wireless telecommunications, the present invention therefore provides a reasonably efficient compressed bit stream within base station components where such compressed bit stream represents wireless communication signals between a base station and mobile stations over the air.

It should be understood that such compressed bit stream is of course particularly advantageous when the modem(s) and radio(s) within any given base station are separated by any significant distance (i.e. not co-located) or where data transport is a limited or costly resource. The present invention is intended for data communications within some physical medium including, but not limited to, optical fiber, copper wire, or printed circuit board (PCB) traces typical of smaller distances such as between adjacent radio and modem modules within a base station. While the present invention is intended for intra-module communication within a base station where the present inventive data compression is applied within an intermediate module, it should be readily apparent to one of ordinary skill in the art that the present invention is not module dependent. That is to say, the compression methodology of the present invention for conversion of complex signals to minimize bit rates is not dependent upon any specific module configuration or physical implementation.

The present Invention is described in terms of compact floating point delta encoding/decoding and utilizes a combination of innovative data compression mechanisms to reduce the number of required bits to represent a signal. Effectively, the present invention represents a zero delay compression scheme with substantially reduced sampling requirements. Each data compression mechanism has value taken alone, though particularly advantageous cumulative benefits are possible when taken together. These data compression mechanisms include exponential encoding/decoding with a shared exponent between the real and Imaginary components of a complex signal, delta-average encoding/decoding, and clipping. Compact floating point delta encoding/decoding in accordance with the present invention involves representing a complex signal in terms of its real and imaginary components.

In terms of the encoding side in accordance with the present invention, let $X=\{x_k\}$ denote a complex value discrete time signal indexed by k. Let $\{M_{I,k}, M_{Q,k}, E_k, \Delta M_{I,k}, \Delta M_{Q,k}, \Delta E_k\}$ denote the compact floating point delta encoded representation of X. Let $Y=\{y_k\}$ denote the numerical value associated with this encoded representation of X. The value of $y_k$ is defined by Equation 1 (Eq. 1).

$$y_k = \begin{cases} (M_{I,k} + j \cdot M_{Q,k}) \cdot 2^{E_k}, & k \text{ even} \\ (\Delta M_{I,k} + j \cdot \Delta M_{Q,k}) \cdot 2^{\Delta E_k}, & k \text{ odd} \end{cases} \quad \text{(Eq. 1)}$$

where $M_{I,k}$ is the (L−N)-bit mantissa for the real component of $y_k|_{k \text{ even}}$, $M_{Q,k}$ is the (L−N)-bit mantissa for the imaginary component of $y_k|_{k \text{ even}}$, $E_k$ is the (2N+S)-bit exponent for $y_k|_{k \text{ even}}$, $\Delta M_{I,k}$ is the (L−N−S)-bit mantissa for the real component of $y_k|_{k \text{ odd}}$, $\Delta M_{Q,k}$ is the (L−N−S)-bit mantissa for the imaginary component of $y_k|_{k \text{ odd}}$, $\Delta E_k$ is the (2N+S)-bit exponent for $y_k|_{k \text{ odd}}$, and j equals $\sqrt{-1}$.

The samples $y_k|_{k \text{ odd}}$ are labeled the delta samples whereas the samples $y_k|_{k \text{ even}}$ are labeled the non-delta samples. Note that the association of delta samples with odd values of k is arbitrary. Also, the association of positive valued exponents with upward scaling is arbitrary. The values for $M_{I,k}$, $M_{Q,k}$, and $E_k$ are chosen by the encoder to minimize the absolute error $|x_k - y_k|$ for all even values of k. The values for $\Delta M_{I,k}$, $\Delta M_{Q,k}$, and $\Delta E_k$ are chosen by the encoder to minimize the quantity $$\left| x_k - f_{n,S}\left( \frac{y_{k-1} + y_{k+1}}{2} \right) \right|$$

for all odd values of k where the function $f_{n,S}(\bullet)$ is defined by Equation 2 (Eq. 2).

$$f_{n,S}(u) = \text{clip}_{n,S}(Re\{u\}) + j \cdot \text{clip}_{n,S}(Im\{u\}) \quad \text{(Eq. 2)}$$

$$\text{clip}_{n,S}(v) = \begin{cases} 2^n - 2^{-S}, & v > 2^n - 2^{-S} \\ -2^n + 2^{-S}, & v < -2^n + 2^{-S} \\ v, & \text{otherwise} \end{cases} \quad \text{(Eq. 3)}$$

The parameter n is the number of integer bits in the full-scale representation of Y. For example, n=0 for signed fractional numbers with a range [−1,+1) whereas n=L−1 for signed integers with a range $[-2^{L-1}, 2^{L-1})$. The parameter S is the difference in number of mantissa bits between non-delta and delta samples per real or imaginary component.

Having a common exponent for the real and imaginary component of Y halves the number of bits required to represent the exponent information compared to case of having separate exponents. The SNR penalty arising from having a common exponent is small due to the fact that the absolute error $|x_k-y_k|$ is dominated by the larger of $\text{Re}\{x_k-y_k\}$ and $\text{Im}\{x_k-y_k\}$ and the encoder chooses the values for $E_k$ and $\Delta E_k$ to minimize the dominant error term. The gain in terms of number of bits saved from having a common exponent more than offsets the slight degradation in SNR.

The average of neighboring samples in the computation of $\Delta M_{I,k}$, $\Delta M_{Q,k}$, and $\Delta E_k$ is used as the reference point for computing the delta sample. The statistical property that adjacent samples of X tend to be correlated is used to reduce the variance of the delta sample. The benefit of the latter is that fewer mantissa bits are required to encode the odd samples of Y for a given SNR.

The parameter S corresponds to the bit saving that is realized via delta averaging. By applying the bit saving to increasing the number of exponent bits, the dynamic range of the exponential format is increased by $20\log_{10}2\cdot(2^{2N+S}-2^{2N})$ dB. Alternatively, the same number of mantissa bits could be used to increase the SNR of the odd samples of Y.

Since $y_k|_{k\ even}$ is known to both the encoder and decoder with exactitude, using $y_k|_{k\ even}$ rather than $x_k|_{k\ even}$ in the computation of delta samples ensures both encoder and decoder use identical reference points for computing the delta samples. This improves the SNR of Y.

The clipping operation in the computation of $\Delta M_{I,k}$, $\Delta M_{Q,k}$, and $\Delta E_k$ ensures that the range spanned by the delta encoding is confined within the range spanned by the signal X. This maximizes the useful range of the signed delta samples which in turn minimizes the absolute error $|x_k-y_k|$ for all odd values of k. The result is an improvement in SNR of the encoded signal.

Note that the mantissa values $M_{I,k}$, $M_{Q,k}$, $\Delta M_{I,k}$, and $\Delta M_{Q,k}$ are least significant bits (LSB) aligned with respect to their fixed-point precision. This implies that $\Delta M_{I,k}$ and $\Delta M_{Q,k}$ have S fewer most significant bits (MSBs) than $M_{I,k}$ and $M_{Q,k}$ respectively. In all, a total of 4L bits are needed to represent a non-delta sample and delta sample pair. This corresponds to an average of L bits per sample per real or imaginary component.

The values of $M_{I,k}$, $M_{Q,k}$, $E_k$, $\Delta M_{I,k}$, $\Delta M_{Q,k}$, and $\Delta E_k$ constitute the output of the compact floating point delta encoder. The encoded data is used for transmission in lieu of un-encoded data. The formatting of the encoded data for the purposes of data transport is arbitrary.

In terms of the decoding side in accordance with the present invention, the compact floating point delta decoder constructs an estimate $\hat{X}=\{\hat{x}_k\}$ of the original signal X via Equation 4 (Eq. 4).

$$\hat{x}_k = \begin{cases} y_k, & k\ \text{even} \\ y_k + f_{n,s}\left(\frac{y_{k-1}+y_{k+1}}{2}\right), & k\ \text{odd} \end{cases} \quad \text{(Eq. 4)}$$

In the above, $y_k$ is derived from the received data using Equation 1.

In the case of X being a real value signal, the present invention as described still applies with $M_{Q,k}$ and $\Delta M_{Q,k}$ set to zero. Hence, $M_{Q,k}$ and $\Delta M_{Q,k}$ need not be sent to the decoder.

In the case of linear (i.e. non-exponential) encoding, the present invention as described still applies with $E_k$ and $\Delta E_k$ set to zero. Hence, $E_k$ and $\Delta E_k$ need not be sent to the decoder.

In the case of non-delta average encoding, the odd samples are processed in the same manner as the even samples. Non-delta average encoding may be preferable for applications in which the signal X has very low correlation between adjacent samples.

The performance of the compact floating point delta codec in accordance with the present invention is assessed in terms of the output SNR that is realized at a given input signal level. The power of the input signal to the encoder normalized relative to full-scale power is given by Equation 5 (Eq. 5).

$$P_{norm} = \frac{E[|X|^2]}{2^{2n+1}}. \quad \text{(Eq. 5)}$$

Where $E[\cdot]$ is the expectation operator, the SNR of the output signal from the decoder is computed as shown in Equation 6. (Eq. 6).

$$SNR = E\left[\left|\frac{X}{\hat{X}-X}\right|^2\right] \quad \text{(Eq. 6)}$$

By way of example, an example system is discussed in terms of application of the present invention to a code division multiplexing (CDMA) system. However, it should be readily understood that any system including a complex signal such as, but not limited to orthogonal frequency division multiplexing (OFDM) or any similar system can benefit by use of the present invention. Accordingly, an example system is herein considered in which the power spectral density function of X is described by the magnitude squared of the discrete Fourier transform of the reference transmit filter coefficients for Spreading Rate 1 in the CDMA standard, TIA/EIA/IS-2000.2B, *Physical Layer Standard for cdma2000 Spread Spectrum Systems*. The sampling rate is assumed to be twice the chip rate for CDMA With reference to FIG. 1, a graphical comparison of a simulated output SNR for different 10-bit quantization formats is shown. The plot of SNR versus $P_{norm}$ for 9E3Δ encoded signals is shown. The notation 9E3Δ is used to denote the format associated with an (L=10, N=1, S=1) encoder. The solid line graph of 9E3Δ represents encoding in accordance with the present invention with both the shared exponential and delta aspects as described above. Here, the SNR is held constant over a wide range of $P_{norm}$ which is beneficial to systems such as OFDM. The SNR curve for a comparable 10-bit floating point non-delta format, but including the shared exponent aspect, is denoted as 9E2. With regard to this a comparable 10-bit floating point non-delta format, the exponential non-delta average format representation of X is given by $y_k=(M_{I,k}+j\cdot M_{Q,k})\cdot 2^{E_k}$ for all values of k. It should be noted that the number of exponent bits is reduced by one due to the loss of the free bit that the delta average encoding provided. For comparison purposes, the SNR curves for 9E3Δ and 9E2 formats along with a 10-bit uniform quantization (i.e., conventional) format are superimposed on the same plot.

As shown by FIG. 1, the 9E3Δ format provides a 36 dB increase in dynamic range and a 1.8 dB increase in peak output SNR compared to a conventional 10-bit uniform quantization format. The extra exponent bit that is realized using delta encoding enables the 9E3Δ format to have a 24 dB improvement in dynamic range compared to 9E2 format.

Figure 2:
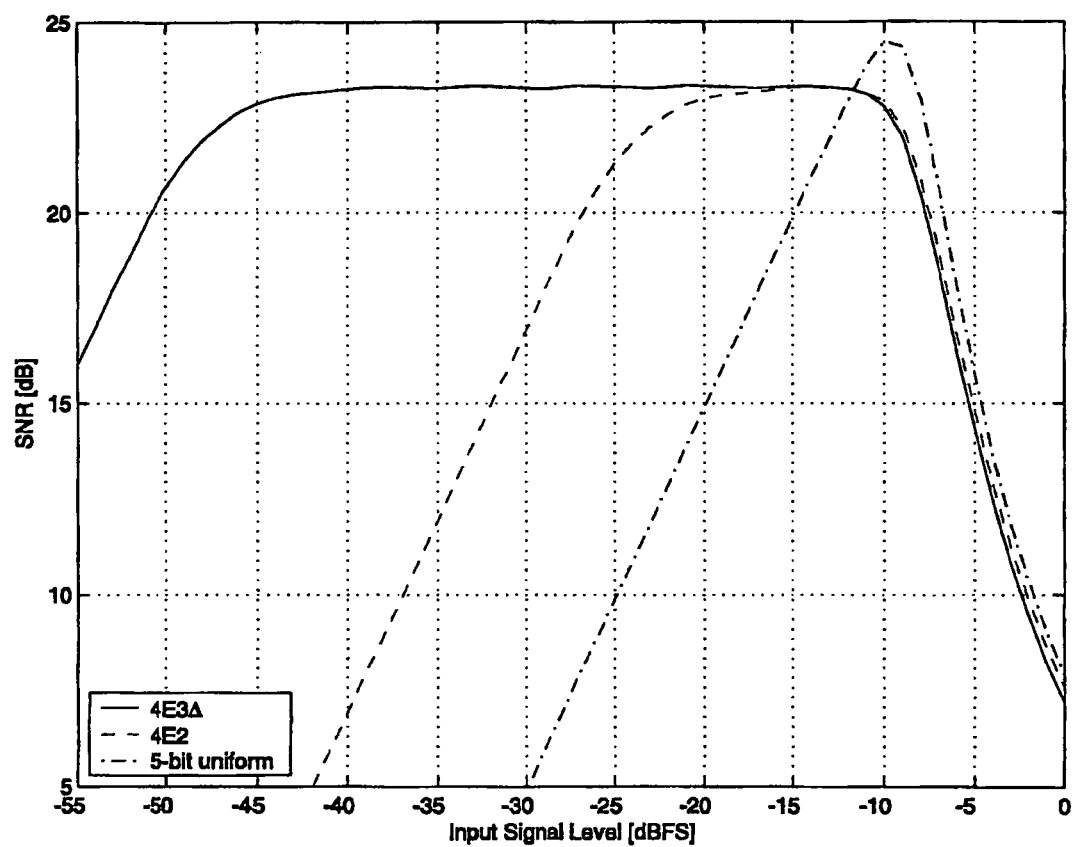
FIG. 2 is a graphical comparison of output SNR for different 5-bit quantization formats.

With reference to FIG. 2, a graphical comparison of a simulated output SNR for different 5-bit quantization formats is shown. Here, the notation 4E3Δ is used to denote the format associated with an (L=5, N=1, S=1) encoder. The plot of SNR versus $P_{norm}$ for 4E3Δ encoded signals is shown. Similar to the graph of FIG. 1, the SNR curves for a comparable 5-bit floating point non-delta format, denoted as 4E2, and a 5-bit uniform quantization format are superimposed on the same plot. The 4E3Δ format provides a 35 dB increase in dynamic range compared to conventional 5-bit uniform quantization. Although there is a reduction in 1.2 dB in peak output SNR, the input single level range over which 5-bit uniform quantization outperforms the 4E3Δ format is limited to a span of 3.3 dB. When averaged over a wide input signal range, the 4E3Δ format outperforms 5-bit uniform quantization. The extra exponent bit that is realized using delta encoding enables the 4E3Δ format to have a 24 dB improvement in dynamic range compared to 4E2 format The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A method of bit conversion and transmission of a digital complex signal over a physical medium, said method comprising:
   receiving a digital complex signal;
   compressing said digital complex signal into a series of bits by sharing a common exponent across real and imaginary components of said complex signal;
   transmitting said series of bits across a physical medium; and
   expanding said series of bits to reconstitute said digital complex signal by again sharing said common exponent across said real and imaginary components of said complex signal, and
   wherein said common exponent is obtained by determining a larger value of either real or imaginary components and designating an exponent of an exponential representation of larger value as the common exponent.

2. The method as claimed in claim 1, wherein said compressing and expanding steps each include delta-averaging.

3. The method as claimed in claim 2, wherein said compressing and expanding steps each include clipping.

* * * * *